(12) United States Patent
Roy et al.

(10) Patent No.: US 11,750,155 B2
(45) Date of Patent: Sep. 5, 2023

(54) CLASS-AB STABILIZATION

(71) Applicant: TEXAS INSTRUMENTS INCORPORATED, Dallas, TX (US)

(72) Inventors: Aniruddha Roy, Bangalore (IN); Kunal Suresh Karanjkar, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/470,985

(22) Filed: Sep. 9, 2021

(65) Prior Publication Data

US 2022/0166393 A1 May 26, 2022

(30) Foreign Application Priority Data

Nov. 25, 2020 (IN) .............................. 202041051297

(51) Int. Cl.
*H03F 3/20* (2006.01)
*H03F 3/45* (2006.01)

(52) U.S. Cl.
CPC ...................................... *H03F 3/20* (2013.01)

(58) Field of Classification Search
CPC ...... H03F 3/20; H03F 2200/153; H03F 1/086; H03F 3/303; H03F 3/45192

USPC ................................ 330/252–261, 285, 296
See application file for complete search history.

(56) References Cited

U.S. PATENT DOCUMENTS 6,496,067 B1 * 12/2002 Behzad ............... H03F 3/45757
330/296
11,233,485 B2 * 1/2022 Zybura ................. H03F 1/3241

OTHER PUBLICATIONS

Langen, et al., "Compact Low-Voltage Power-Efficient Operational Amplifier Cells for VLSI", IEEE Journal of Solid-State Circuits vol. 33, No. 10, Oct. 1998, 15 pgs.

* cited by examiner

*Primary Examiner* — Hieu P Nguyen
(74) *Attorney, Agent, or Firm* — Mandy Barsilai Fernandez; Frank D. Cimino

(57) ABSTRACT

Aspects of the description provide for a circuit. In some examples, the circuit includes a input pair of transistors, a bias transistor having a bias transistor gate, a bias transistor drain, and a bias transistor source, the bias transistor drain coupled to the input pair of transistors and the bias transistor source coupled to ground, and a resistor coupled between the bias transistor gate and the input pair of transistors.

20 Claims, 3 Drawing Sheets

CLASS-AB STABILIZATION

CROSS-REFERENCE TO RELATED APPLICATIONS

The present application claims priority to India Provisional Patent Application No. 202041051297, which was filed Nov. 25, 2020, is titled "Stabilization Of Class-AB Loop For Low Voltage Class-AB Architecture," and is hereby incorporated herein by reference in its entirety.

BACKGROUND

In certain circuit topologies, such as amplifiers, feedback is implemented as an aspect of controlling operation of the circuit. That feedback may be stabilized to prevent, or mitigate, the aspects of the feedback from adversely affecting performance of the circuit.

SUMMARY

Some aspects of the description provide for an amplifier. In some examples, the amplifier includes a first transistor having a first transistor source and a first transistor drain, and a second transistor having a second transistor gate, a second transistor source, and a second transistor drain. The first transistor drain is coupled to an output of the amplifier, the second transistor source is coupled to the first transistor source, and the second transistor drain is coupled to the output of the amplifier. The feedback transistor has a feedback transistor gate, a feedback transistor source, and a feedback transistor drain. The feedback transistor source is coupled to ground and the feedback transistor drain is coupled to the second transistor gate. The resistor is coupled between the second transistor gate and the feedback transistor gate.

Some aspects of the description provide for a circuit. In some examples, the circuit includes a first transistor and a negative feedback circuit. The first transistor has a first transistor gate and a first transistor drain. The first transistor drain is coupled to an output of the circuit. The negative feedback circuit is coupled to the first transistor gate. The negative feedback circuit is adapted to bias the first transistor to provide negative feedback to the circuit. The negative feedback circuit includes a second transistor, a resistor, a third transistor, and a current mirror. The second transistor has a second transistor gate, a second transistor source, and a second transistor drain. The second transistor source is adapted to be coupled to ground and the second transistor drain is coupled to the first transistor gate. The resistor is coupled between the first transistor gate and the second transistor gate. The third transistor has a third transistor gate, a third transistor source, and a third transistor drain. The third transistor gate is coupled to the output of the circuit and the third transistor drain is coupled to the first transistor drain. The fourth transistor has a fourth transistor gate, a fourth transistor source, and a fourth transistor drain. The fourth transistor gate is coupled to the output of the circuit and the third transistor source is adapted to be coupled to ground. The current mirror is coupled between the third transistor source and the fourth transistor drain.

Some aspects of the description provide for a circuit. In some examples, the circuit includes an input pair of transistors, a bias transistor having a bias transistor gate, a bias transistor drain, and a bias transistor source, the bias transistor drain coupled to the input pair of transistors and the bias transistor source adapted to be coupled to ground, and a resistor coupled between the bias transistor gate and the input pair of transistors.

BRIEF DESCRIPTION OF THE DRAWINGS

For a detailed description of various examples, reference will now be made to the accompanying drawings in which.

DETAILED DESCRIPTION

In some circuit topologies, such as class-AB amplifiers, or other amplifier structures, negative feedback is implemented. The negative feedback may provide for stability in the circuit, such as to reduce time domain ringing and frequency domain peaking. However, the negative feedback may also introduce a pole into a frequency response of the amplifier. If the pole is near, or within, a unity-gain bandwidth of the amplifier, stability of the amplifier may be adversely affected. In at least some examples, existence of the pole is inherent to a negative feedback loop of the amplifier, such as being inherent to a component of the negative feedback loop (e.g., such as a parasitic capacitance of a transistor). In this way, introduction of the pole into the frequency response of the amplifier may be unavoidable when a negative feedback loop is also implemented.

Aspects of this description provide for increasing stability of an amplifier having a negative feedback loop. In some examples, the stability is increased by adding an additional component, or components, into the negative feedback loop to shift a position of the pole. In some examples, the stability is increased by an additional component, or components, into the negative feedback loop to at least partially mitigate or negate the pole. In some examples, the stability is increased by dividing, separating, and/or replicating components of the amplifier, such as a by splitting an input transistor pair of the amplifier.

Figure 1:
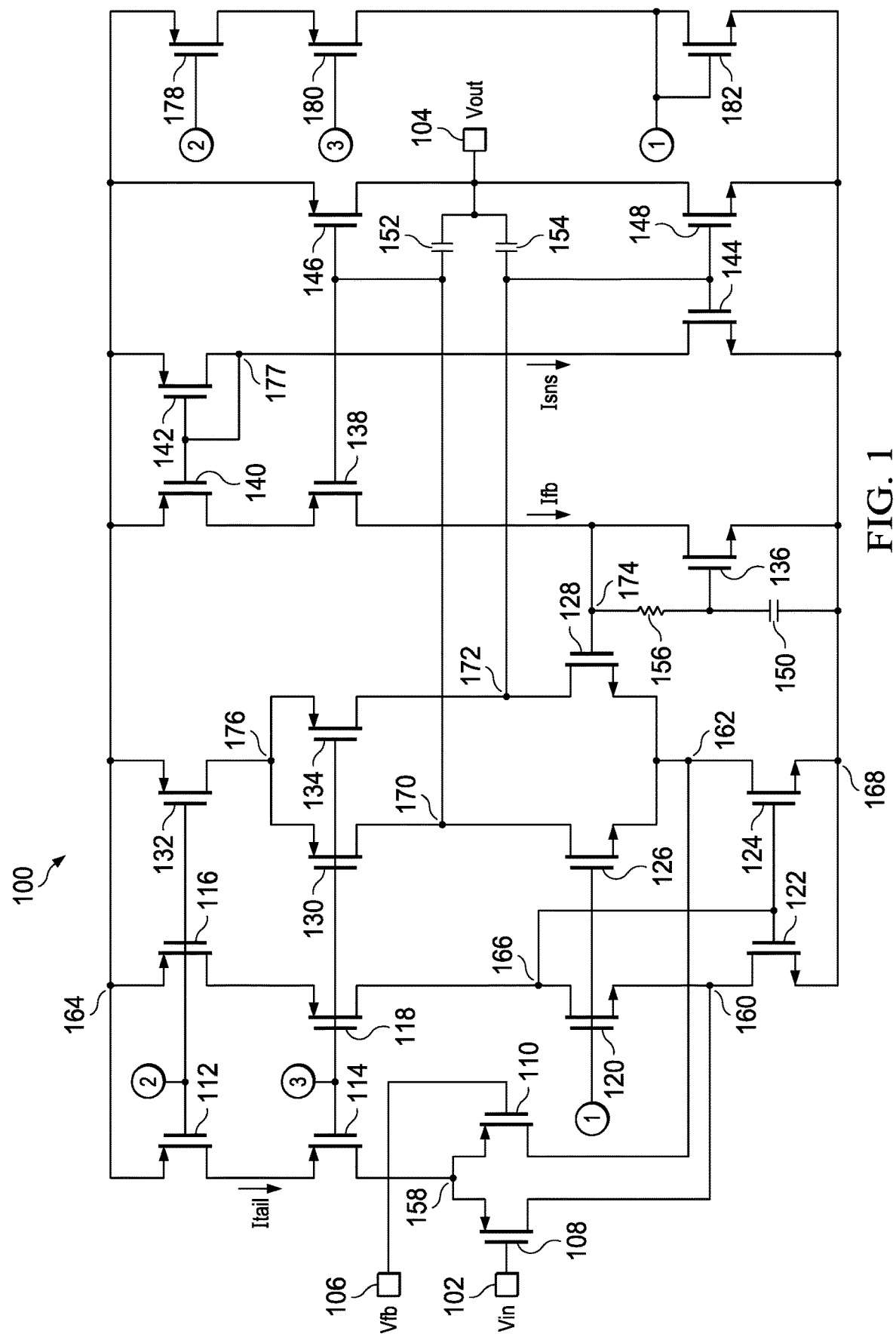
FIG. 1 shows a circuit diagram of an amplifier in accordance with various examples.

FIG. 1 shows a circuit diagram of an amplifier 100 in accordance with various examples. In at least some examples, the amplifier 100 is a class-AB operational amplifier. The amplifier 100 may receive an input signal at an input voltage (VIN) node 102 and provide an output signal at an output voltage (VOUT) node 104. The node 104 may correspond to a positive input of a differential input pair of the amplifier 100. In at least some examples, the amplifier 100 also includes a feedback voltage (VFB) node 106. The node 106 may correspond to a negative input of the differential input pair of the amplifier 100. A feedback signal may be received at the VFB node 106 and may be based at least partially on value of VOUT. Although not shown, in some examples the VFB node 106 is coupled to the VOUT node 104. For example, the VFB node 106 may be coupled to the VOUT node 104 through one or more intervening components, or without intervening components. In at least some examples, the amplifier 100 includes a transistor 108, a transistor 110, a transistor 112, a transistor 114, a transistor 116, a transistor 118, a transistor 120, a transistor 122, a transistor 124, a transistor 126, a transistor 128, a transistor 130, a transistor 132, a transistor 134, a transistor 136, a transistor 138, a transistor 140, a transistor 142, a transistor 144, a transistor 146, a transistor 148, a capacitor 150, a capacitor 152, a capacitor 154, a resistor 156, a transistor 178, a transistor 180, and a transistor 182. In at least some examples, relationships may exist between the sizes (e.g., widths or width-to-length ratios) of some of the components of the amplifier 100. For example, the transistor 136 may have a size that is N times larger than a size of the transistor 182, where N is any suitable positive, real-number value. Similarly, the transistor 148 may have a size that is M times larger than a size of the transistor 144, where M is any suitable positive, real-number value. The transistor 138 and the transistor 140 may have an approximately same size, with the transistor 142 having a size that is K times larger than the size of the transistor 140 and the transistor 146 having a size that is P times larger than the size of the transistor 138, where K and P are each any suitable positive, real-number values.

In an example architecture of the amplifier 100, the transistor 108 has a gate coupled to the VIN node 102, a source coupled to a node 158, and a drain coupled to a node 160. The transistor 110 has a gate coupled to the VFB node 106, a source coupled to the node 158, and a drain coupled to a node 162. The transistor 112 has a drain coupled to a node 164, a source, and a gate. The transistor 114 has a drain coupled to the source of the transistor 112, a source coupled to the node 158, and a gate. The transistor 116 has a source coupled to the node 164, a gate coupled to the gate of the transistor 112, and a drain. The transistor 118 has a source coupled to the drain of the transistor 116, a gate coupled to the gate of the transistor 114, and a drain coupled to a node 166. The transistor 120 has a drain coupled to the node 166, a source coupled to the node 160, and a gate. The transistor 122 has a gate coupled to the node 166, a drain coupled to the node 160, and a source coupled to a node 168. The transistor 124 has a gate coupled to the node 166, a drain coupled to the node 162, and a source coupled to the node 168. In at least some examples, the transistor 122 and the transistor 124 form a current mirror between the node 160 and the node 162. In at least some examples, the amplifier 100 may include a negative feedback loop. The negative feedback loop may attempt to control an amount of current provided to the VOUT node 104 to cause VFB to approximately equal VIN. The negative feedback loop may include the transistors 126-134, the capacitor 152, the capacitor 154, the transistors 138-144, the capacitor 150, and the resistor 156.

The transistor 126 has a gate coupled to the gate of the transistor 120, a drain coupled to a node 170, and a source coupled to the node 162. The transistor 128 has a drain coupled to a node 172, a gate coupled to a node 174, and a source coupled to the node 162. The transistor 126 and the transistor 128 may together be an input transistor pair (which may also be referred to as a differential input pair or a class-AB input pair) of the amplifier 100. The transistor 130 has a gate coupled to the gate of the transistor 114, a drain coupled to the node 170, and a source coupled to a node 176. The transistor 132 has a gate coupled to the gate of the transistor 112, a drain coupled to the node 176, and a source coupled to the node 164. The transistor 134 has a gate coupled to the gate of the transistor 114, a drain coupled to the node 172, and a source coupled to the node 176.

The transistor 136 has a gate coupled, or adapted to be coupled, through the resistor 156 to the node 174 and coupled, or adapted to be coupled, through the capacitor 150 to the node 168. The transistor 136 also has a drain coupled to the node 174 and a source coupled to the node 168. The transistor 138 has a gate coupled to the node 170, a drain coupled to the node 174, and a source. The transistor 140 has a gate coupled to a node 177, a drain coupled to the source of the transistor 138, and a source coupled to the node 164. The transistor 142 has a gate coupled to the node 177, a drain coupled to the node 177, and a source coupled to the node 164. In at least some examples, the transistor 140 and the transistor 142 form a current mirror between the node 177 and the source of the transistor 138.

The transistor 144 has a gate coupled to the node 172, a drain coupled to the node 177, and a source coupled to the node 168. The transistor 146 has a gate coupled to the node 170, a drain coupled to the VOUT node 104, and a source coupled to the node 164. The transistor 148 has a gate coupled to the node 172, a drain coupled to the VOUT node 104, and a source coupled to the node 168. The VOUT node 104 is coupled, or is adapted to be coupled, to the node 170 via the capacitor 152. The VOUT node 104 is coupled, or is adapted to be coupled, to the node 172 via the capacitor 154. The transistor 178 has a gate coupled to the gate of the transistor 112, a source coupled to the node 164, and a drain. The transistor 180 has a gate coupled to the gate of the transistor 114, a source coupled to the drain of the transistor 178, and a drain. The transistor 182 has a gate coupled to the gate of the transistor 120, a drain coupled to the gate of the transistor 120, and a source coupled to the node 168.

In at least some examples, the node 164 is adapted to couple to a voltage supply (not shown) to receive a first supply voltage at the node 164. In at least some examples, the node 164 is adapted to couple to a voltage supply (not shown) to receive a second supply voltage at the node 168. In at least some examples, the second supply voltage is a ground voltage potential. In other examples, the second supply voltage may have a non-zero value that is greater than, or less than, the first supply voltage. In some examples, the amplifier 100 may be adapted to couple to separate voltage supplies at the node 164 and the node 168, while in other examples the amplifier 100 may be adapted to couple to the same voltage supply at the node 164 and the node 168 (e.g., such as positive and negative nodes or terminals of the same voltage supply).

In an example of operation of the amplifier 100, VIN is received at the VIN node 102 having a value greater than a value of VFB as received at the VFB node 106. In such an example, the amplifier 100 attempts to provide an amount of current to the VOUT node 104 to cause VOUT to increase in value an amount sufficient to cause VFB to increase in value to approximately equal the value of VIN. Conversely, VIN may be received at the VIN node 102 having a value lesser than a value of VFB as received at the VFB node 106. In such an example, the amplifier 100 attempts to provide an amount of current to the VOUT node 104 to cause VOUT to decrease in value an amount sufficient to cause VFB to decrease in value to approximately equal the value of VIN. Operation of the amplifier 100 may be substantially similar in each of these operational circumstances. Therefore, the example in which VIN is greater in value than VFB is used herein to describe operation of the amplifier 100. For example, a tail current (Itail) flows through the transistor 112 and the transistor 114 to the node 158. Responsive to receipt of VIN having a value greater than VFB, an amount of current flows from the node 158, through the transistor 110, to the node 162. Current also flows from the node 168 through the transistor 122 and the transistor 108 to the node 158 such that a sum of current flowing into and out of the node 158 is approximately zero. The current flowing through the transistor 122 is mirrored to also flow through the transistor 124 to the node 162, summing at the node 162 with the current flowing through the transistor 110. The current flowing through the node 162 flows through the transistor 126 and the transistor 128 to the node 170 and the node 172, respectively. The current that flows through the transistor 126 and the transistor 128 may be determined according to a ratio of widths of the transistor 126 to the transistor 128. The current flowing through the node 170 flows through the capacitor 152 to the VOUT node 104 and the current flowing through the node 172 flows through the capacitor 154 to the VOUT node 104, each to charge the VOUT node 104. In at least some examples, the capacitor 152 and the capacitor 154 are Miller compensation capacitors in the amplifier 100.

In at least some examples, the transistor 146 sources current to the VOUT node 104 responsive to a load (not shown) coupled to the VOUT node 104 drawing or sinking current. To source current to the VOUT node 104, the amplifier 100 decreases the potential at the gate of the transistor 146 (e.g., the node 170), increasing conductance of the transistor 146. Similarly, the potential at the gate of the transistor 138 decreases, causing the transistor 138 to operate in a saturation region, or mode, of operation in which the transistor 138 operates as a cascode transistor. Responsive to the transistor 138 operating as a cascode transistor, a current flowing through the transistor 138 is determined based on a current flowing through the transistor 140, which may be determined based on the transistor 142 according to the current mirror formed by the transistor 140 and the transistor 142. In at least some examples, responsive to a voltage provided at the node 172 being a threshold amount greater than a voltage provided at the node 168, a sense current (Isns) flows through the transistor 144 and therefore the transistor 142, and Isns is mirrored to flow through the transistor 140 as a feedback current (Ifb).

Ifb charges a parasitic capacitance provided at the node 174, causing a potential provided at the node 174 to increase. Responsive to the potential provided at the node 174 increasing, the potential provided at the node 172 may decrease and the potential provided at the node 170 may increase, such as via operation of the transistor 128 and the transistor 126, respectively. Responsive to the potential provided at the node 172 decreasing, the potential provided at the gate of the transistor 144 decreases and Isns decreases. Responsive to the decrease in current flowing through the transistor 142, the current mirrored to the transistor 140 and flowing through the transistor 138 decreases, decreasing a potential provided at the node 174. Responsive to the potential provided at the node 174 decreasing, the potential provided at the node 172 may increase and the potential provided at the node 170 may decrease, such as via operation of the transistor 128 and the transistor 126, respectively. Responsive to the potential provided at the node 172 increasing, the potential provided at the gate of the transistor 144 increases and Isns increases. Responsive to the increase in current flowing through the transistor 142, Ifb increases, again increasing a potential provided at the node 174. Similarly, as the potential provided at the node 170 increases, the current through transistor 138 tends to decrease, in turn decreasing the potential provided at the node 174. In this way, the amplifier 100 includes negative feedback that seeks to control a potential provided at the node 174 to approximately equal a potential provided at the gate of the transistor 120.

In at least some examples, responsive to the potential provided at the node 174 approximately equaling the potential provided at the gate of the transistor 120, Isns is approximately equal to a current flowing through the transistor 136, which is approximately equal to a current flowing through the transistor 182. In such an example, with the amplifier 100 sourcing a load current at the VOUT node 104, a current flowing through the transistor 148 may be approximately equal to a real number multiple of the current flowing through the transistor 182, where the real number is equal to a ratio of widths of the transistor 136 to the transistor 182.

In at least some examples, rather than sourcing current to the VOUT node 104, the amplifier 100 (e.g., at least via the transistor 148) sinks current from the VOUT node 104 responsive to a load (not shown) coupled to the VOUT node 104 providing, or sourcing, current. To sink current from the VOUT node 104, the amplifier 100 increases the potential at the gate of the transistor 148 (e.g., the node 172), increasing conductance of the transistor 148. Similarly, the potential at the gate of the transistor 144 increases, increasing Isns and decreasing a potential provided at the node 177. The decreased potential causes the transistor 140 to operate in a linear region, or mode, of operation in which the transistor 140 operates as a switch. Responsive to the transistor 140 operating as a switch, Ifb becomes determined based on a current flowing through the transistor 146, such as via a current mirror formed by the transistor 138 and the transistor 146.

Ifb charges the parasitic capacitance provided at the node 174, causing a potential provided at the node 174 to increase. Responsive to the potential provided at the node 174 increasing, the potential provided at the node 172 may decrease and the potential provided at the node 170 may increase, such as via operation of the transistor 128 and the transistor 126, respectively. As the potential provided at the node 170 increases, the current through transistor 138 tends to decrease, in turn decreasing the potential provided at the node 174. Responsive to the potential provided at the node 172 decreasing, the potential provided at the gate of the transistor 144 decreases and a current flowing through the transistor 144 (and transistor 142) decreases. Responsive to the decrease in current flowing through the transistor 142, the current mirrored to the transistor 140 and flowing through the transistor 138 decreases, decreasing a potential provided at the node 174. Responsive to the potential provided at the node 174 decreasing, the potential provided at the node 172 may increase and the potential provided at the node 170 may decrease, such as via operation of the transistor 128 and the transistor 126, respectively. Responsive to the potential provided at the node 172 increasing, the potential provided at the gate of the transistor 144 increases and a current flowing through the transistor 144 (and transistor 142) increases. Responsive to the increase in current flowing through the transistor 142, the current mirrored to the transistor 140 and flowing through the transistor 138 increases, again increasing a potential provided at the node 174. In this way, the amplifier 100 includes negative feedback that seeks to control a potential provided at the node 174 to approximately equal a potential provided at the gate of the transistor 120.

In at least some examples, responsive to the potential provided at the node 174 approximately equaling the potential provided at the gate of the transistor 120, a current flowing through the transistor 144 is approximately equal to a current flowing through the transistor 136, which is approximately equal to a current flowing through the transistor 182. In such an example, with the amplifier 100 sinking a load current at the VOUT node 104, a current flowing through the transistor 146 may be approximately equal to a real number multiple of the current flowing through the transistor 182, where the real number is equal to a ratio of widths of the transistor 136 to the transistor 182.

The transistor 136 may bias the transistor 128. Therefore, to provide for proper operation of the amplifier 100 a gate-to-source voltage (Vgs) of the transistor 136 may be greater than, or equal to, Vgs of the transistor 128 plus a drain-to-source voltage (Vds) of the transistor 124. This Vgs of the transistor 136 may be comparatively large, leading to the transistor 136 being a weak transistor that has a parasitic capacitance (Cpara) that is comparatively large (e.g., such as about 500 femtofarads). The comparatively large Cpara may cause the transistor 136 to be slow to respond to signal transients, which may cause the amplifier 100 to also be slow to respond to signal transients. For example, the delay may be caused by the location of a pole in a frequency response of the transistor 136, which may have a value of approximately G136/Cpara, wherein G136 is a transconductance of the transistor 136. If the pole is within a unity-gain bandwidth of the amplifier 100, the delay may contribute to ringing or signal oscillation being provided at the VOUT node 104.

To mitigate effects of this pole, in some examples, the resistor 156 is coupled between the node 174 and the gate of the transistor 136 to introduce a zero in the frequency response of the transistor 136. This may effectively split Cpara into two separate, approximately equal value, parasitic capacitances—Cpara1 experienced between the drain of the transistor 136 (e.g., the node 174) and the node 168 and Cpara2 experienced between the gate of the transistor 136 and the node 168. In such an example, the resistor 156 may be selected to have a resistance value of approximately 1/G136. However, the resistor 156 alone may not mitigate the effects of the pole, in some operational circumstances. Therefore, in some examples, the capacitor 150 may be coupled between the gate of the transistor 136 and the node 168. In at least some examples, a capacitance of the capacitor 150 may be selected such that a capacitance between the gate of the transistor 136 and the node 168 is increased. In some examples, resistance of the resistor 156 (R156) and capacitance of the capacitor 150 (C158) are selected according to the following equation 1, in which ω is the unity-gain bandwidth of the amplifier 100 and a remainder of the variables are as defined above.

$$\frac{G136}{(C158 + Cpara1 + Cpara2)} < \frac{1/R156}{(C158 + Cpara2)} < G136 * R158 * \omega \quad (1)$$

In at least some examples, the resistor 156 and the capacitor 150 may compensate for instability in the amplifier 100, resulting in increased performance of the amplifier 100. At least one example of the increased performance is a reduction in ringing or oscillation in a signal provided at the VOUT node 104.

While the amplifier 100 is described herein as having feedback applied at an n-type side of the amplifier 100 (e.g., via the transistor 126 and the transistor 128), the feedback may instead be applied at a p-type side of the amplifier 100 (e.g., via the transistor 130 and the transistor 134). Operation of the amplifier 100 may be substantially similar in such an implementation, thus description of such an implementation is not included herein.

Figure 2:
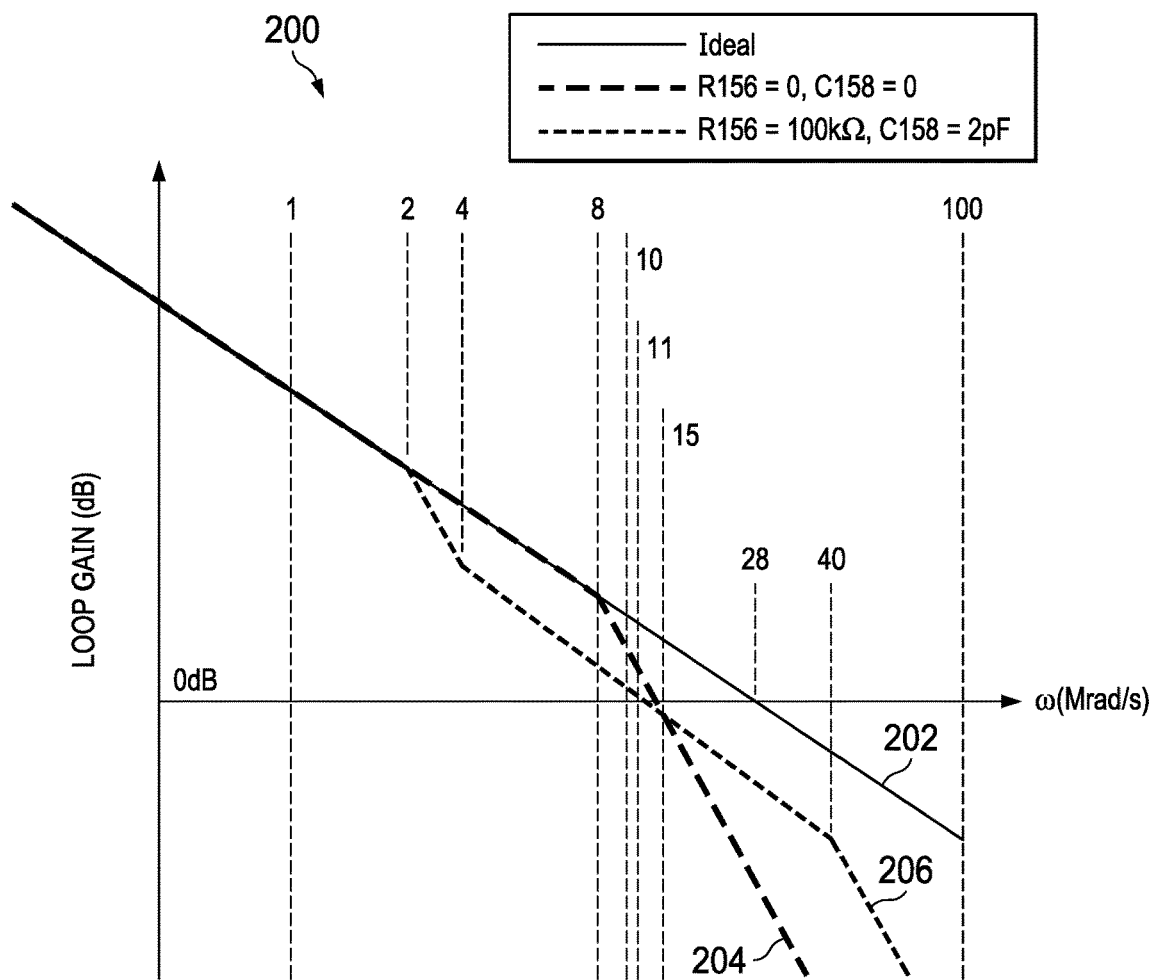
FIG. 2 shows a frequency response diagram in accordance with various examples.

FIG. 2 shows a frequency response diagram 200 in accordance with various examples. In at least some examples, the diagram 200 may be a Bode plot or Bode diagram that is at least partially representative of a frequency response in the amplifier 100 of FIG. 1. Accordingly, reference may be made to aspects of FIG. 1 in describing the diagram 200. As shown in the diagram 200, a horizontal axis may be representative of co in units of mega radians per second (Mrad/s) and a vertical axis may be representative of a loop gain of the amplifier 100 in units of decibels (dB). The diagram 200 assumes values of 250 femtofarads for Cpara1 and Cpara2.

Figure 3:
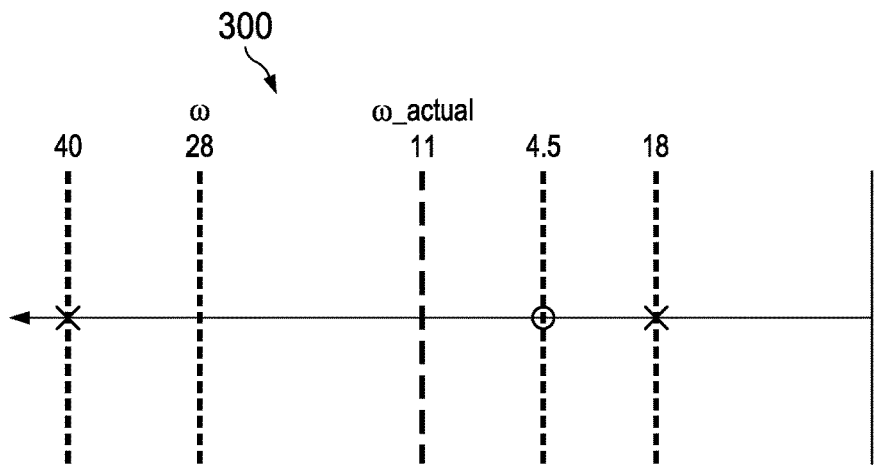
FIG. 3 shows a diagram of frequency response locations of zeros and poles in accordance with various examples.

As shown in the diagram 200, ideal performance of the amplifier 100 may be linear in nature, having a co (e.g., ω_ideal) of about 28 Mrad/s. A frequency response of the amplifier 100 with ideal performance is designated as element 202. Due to process variation in components of the amplifier 100, operational characteristics, environmental effects, circuit instability, signal noise, and/or other factors, ideal performance may not be achievable. Instead, a non-compensated performance (e.g., "normal" performance) of the amplifier 100 may have a co of about 15 Mrad/s, with a frequency response pole at about 8 Mrad/s, above which co decreases rapidly in value. A frequency response of the non-compensated amplifier 100 is designated as element 204. However, if compensated by the resistor 156 and the capacitor 150, as described above, performance of the amplifier 100 may be increased. For example, for values of R156 approximately equal to 100 kiloohms and C158 approximately equal to 2 picofarads (pF), the amplifier 100 may have a co (e.g., ω_actual) of about 11 Mrad/s, with a frequency response poles at about 1.8 and 40 Mrad/s, as well as a frequency response zero at about 4.5 Mrad/s. A frequency response of the amplifier 100 including compensation is designated as element 206. The pole and zero locations in the frequency response of the amplifier 100 are also shown in FIG. 3, which shows a diagram 300 of frequency response locations of zeros and poles in the amplifier 100, in accordance with various examples, and as described above with reference to the diagram 200. In the diagram 300, a pole is represented as an X and a zero is represented as a solid dot (e.g., •).

Figure 4:
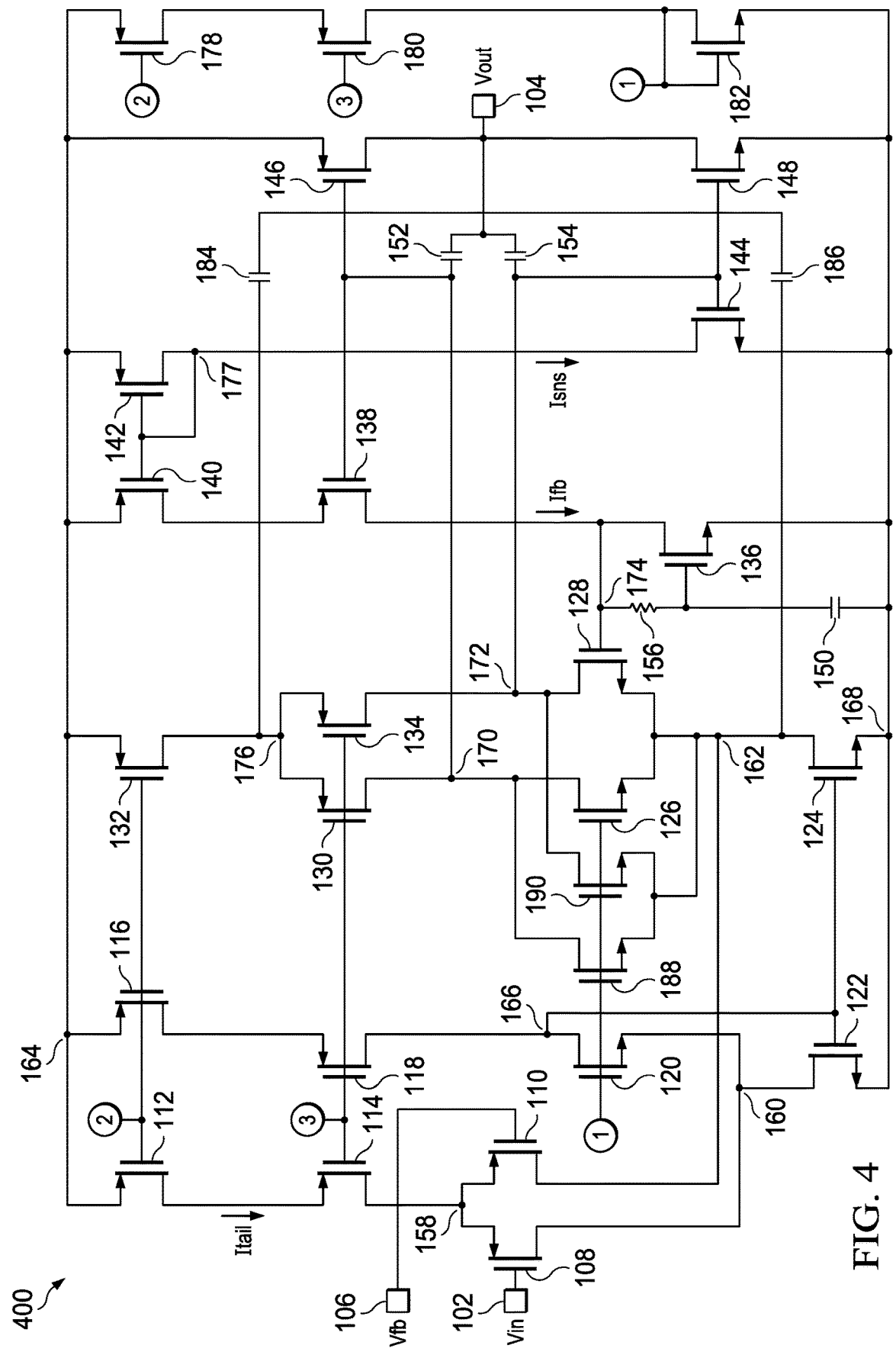
FIG. 4 shows a circuit diagram of an amplifier in accordance with various examples.

FIG. 4 shows a circuit diagram of an amplifier 400 in accordance with various examples. In at least some examples, at least some components of the amplifier 400 may be the same or substantially similar to those of the amplifier 100, and therefore are not described again with reference to the amplifier 400. In at least some examples, the amplifier 400 is a class-AB operational amplifier. The amplifier 400 may include a capacitor 184, a capacitor 186, a transistor 188, and a transistor 190.

In an example architecture of the amplifier 400, the capacitor 184 is coupled between the VOUT node 104 and the node 176 and the capacitor 186 is coupled between the VOUT node 104 and the node 162. Thus, the capacitor 184 and the capacitor 186 may provide cascode compensation. In at least some examples, the cascode compensation may provide increase performance with regard to power consumption and/or bandwidth in comparison to Miller compensation. In at least some examples, a ratio of capacitance of the capacitor 184 and the capacitor 186 to the capacitor 152 and the capacitor 154, respectively, may be about 3:1, about 4:1, or any other suitable ratio. The capacitor 184 and the capacitor 186 may operate as common-mode capacitors that do not alter co of the amplifier 400. However, their presence may cause a pole in the frequency response of the amplifier 400 to shift from outside of co to within co, creating instability as described above.

To mitigate the adverse effects of the cascode compensation on stability of the amplifier 400, the transistor 126 and the transistor 128 may be implemented as split-pair transistors, coupled in parallel with the transistor 188 and the transistor 190, respectively. The transistor 188 and the transistor 190 may have a size ratio to the transistor 126 and the transistor 128, respectively, of about (K−1):1, where K is any suitable integer greater than or equal to 2. In at least some examples, implementing the transistor 126 and the transistor 128 as split-pair transistors in this manner may reduce ω to a value of approximately $$\frac{\omega}{K},$$

which may cause the pole shifted in the frequency response of the amplifier 400 by the cascode compensation to lie outside $$\frac{\omega}{K}.$$

In this way, the split-pair transistors improve stability of the amplifier 400. In at least some examples, the split-pair transistors may be implemented without including the cascode capacitance (e.g., the amplifier 400 may include the transistor 188 and the transistor 190 but not include the capacitor 184 or the capacitor 186). For example, the split-pair transistors may be implemented to reduce a bandwidth of the amplifier 400. In some examples, the resistor 156 and/or the capacitor 150 may be omitted when the split-pair transistors are implemented.

The term "couple" is used throughout the specification. The term may cover connections, communications, or signal paths that enable a functional relationship consistent with this description. For example, if device A provides a signal to control device B to perform an action, in a first example device A is coupled to device B, or in a second example device A is coupled to device B through intervening component C if intervening component C does not substantially alter the functional relationship between device A and device B such that device B is controlled by device A via the control signal provided by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While certain components may be described herein as being of a particular process technology, these components may be exchanged for components of other process technologies. Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitor, respectively, coupled in parallel between the same nodes. For example, a resistor or capacitor shown and described herein as a single component may instead be multiple resistors or capacitor, respectively, coupled in series between the same two nodes as the single resistor or capacitor.

Uses of the phrase "ground voltage potential" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means+/−10 percent of the stated value. Modifications are possible in the described examples, and other examples are possible within the scope of the claims.

What is claimed is:

1. An amplifier, comprising:
    a first transistor having a first transistor source and a first transistor drain, the first transistor drain coupled to an output of the amplifier;
    a second transistor having a second transistor gate, a second transistor source, and a second transistor drain, the second transistor source coupled to the first transistor source and the second transistor drain coupled to the output of the amplifier;
    a feedback transistor having a feedback transistor gate, a feedback transistor source, and a feedback transistor drain, the feedback transistor source coupled to ground and the feedback transistor drain coupled to the second transistor gate; and
    a resistor coupled between the second transistor gate and the feedback transistor gate.

2. The amplifier of claim 1, further comprising a capacitor coupled between the feedback transistor gate and ground.

3. The amplifier of claim 2, wherein the capacitor has a capacitance and the resistor has a resistance selected according to:

$$\frac{G}{(C+Cp1+Cp2)} < \frac{1/R}{(C+Cp2)} < G*R,$$

where G is a transconductance of the feedback transistor, Cp1 is a first parasitic capacitance of the feedback transistor existing between the feedback transistor drain and the feedback transistor source, Cp2 is a second parasitic capacitance of the feedback transistor existing between the feedback transistor gate and the feedback transistor source, C is the capacitance of the capacitor, and R is the resistance of the resistor.

4. The amplifier of claim 1, wherein the amplifier is a class-AB amplifier.

5. The amplifier of claim 1, wherein the first transistor has a first transistor gate, the amplifier further comprising:
a third transistor having a third transistor source, a third transistor drain, and a third transistor gate, the third transistor drain coupled to the output of the amplifier, the third transistor source coupled to the first transistor source, and the third transistor gate coupled to the first transistor gate; and
a fourth transistor having a fourth transistor gate, a fourth transistor source, and a fourth transistor drain, the fourth transistor source coupled to the second transistor source, the fourth transistor drain coupled to the output of the amplifier, and the fourth transistor gate coupled to the second transistor gate.

6. The amplifier of claim 5, further comprising:
a first capacitor coupled between the output of the amplifier and the first transistor source; and
a second capacitor coupled between the output of the amplifier and the first transistor drain.

7. The amplifier of claim 6, wherein the second capacitor is coupled to the first transistor drain through a cascode transistor pair.

8. The amplifier of claim 1, wherein the first, second, and feedback transistors are transistors of the n-type.

9. A circuit, comprising:
a first transistor having a first transistor gate and a first transistor drain, the first transistor drain coupled to an output of the circuit; and
a negative feedback circuit coupled to the first transistor gate, the negative feedback circuit adapted to bias the first transistor to provide negative feedback to the circuit, the negative feedback circuit comprising:
a second transistor having a second transistor gate, a second transistor source, and a second transistor drain, the second transistor source adapted to be coupled to ground and the second transistor drain coupled to the first transistor gate;
a resistor coupled between the first transistor gate and the second transistor gate;
a third transistor having a third transistor gate, a third transistor source, and a third transistor drain, the third transistor gate coupled to the output of the circuit and the third transistor drain coupled to the first transistor drain;
a fourth transistor having a fourth transistor gate, a fourth transistor source, and a fourth transistor drain, the fourth transistor gate coupled to the output of the circuit and the third transistor source adapted to be coupled to ground; and
a current mirror coupled between the third transistor source and the fourth transistor drain.

10. The circuit of claim 9, wherein the negative feedback circuit includes a capacitor adapted to be coupled between the first transistor gate and ground.

11. The circuit of claim 9, wherein the first transistor has a first transistor source and the circuit further comprises a fifth transistor having a fifth transistor drain and a fifth transistor source, the fifth transistor drain coupled to the output of the circuit and the fifth transistor source coupled to the first transistor source.

12. The circuit of claim 11, wherein the fifth transistor has a fifth transistor gate, and the circuit further comprises:

a sixth transistor having a sixth transistor source, a sixth transistor drain, and a sixth transistor gate, the sixth transistor drain coupled to the output of the circuit, the sixth transistor source coupled to the first transistor source, and the sixth transistor gate coupled to the first transistor gate; and
a seventh transistor having a seventh transistor gate, a seventh transistor source, and a seventh transistor drain, the seventh transistor source coupled to the fifth transistor source, the seventh transistor drain coupled to the output of the circuit, and the seventh transistor gate coupled to the fifth transistor gate.

13. The circuit of claim 12, further comprising:
a second capacitor coupled between the first transistor drain of the first transistor and the output of the circuit; and
a third capacitor coupled between the fifth transistor drain of the fifth transistor and the output of the circuit.

14. The circuit of claim 13, further comprising:
a fourth capacitor coupled between the output of the circuit and the first transistor source and the fifth transistor source; and
a fifth capacitor coupled between the output of the circuit, the first transistor drain, and the fifth transistor drain.

15. The circuit of claim 14, wherein the fifth capacitor is coupled to the first transistor drain and the fifth transistor drain through a cascode transistor pair.

16. A circuit, comprising:
an input pair of transistors;
a bias transistor having a bias transistor gate, a bias transistor drain, and a bias transistor source, the bias transistor drain coupled to the input pair of transistors and the bias transistor source adapted to be coupled to ground;
a resistor coupled between the bias transistor gate and the input pair of transistors; and
a capacitor adapted to be coupled between the bias transistor gate and ground.

17. The circuit of claim 16, wherein a first parasitic capacitance exists between the bias transistor drain and ground and a second parasitic capacitance exists between the bias transistor gate and ground.

18. The circuit of claim 17, wherein the resistor compensates for an effect of the first parasitic capacitance on a frequency response of the circuit, and wherein the capacitor compensates for an effect of the second parasitic capacitance on a frequency response of the circuit.

19. The circuit of claim 18, wherein the capacitor has a capacitance and the resistor has a resistance selected according to:

$$\frac{G}{(C+Cp1+Cp2)} < \frac{1/R}{(C+Cp2)} < G*R,$$

where G is a transconductance of the bias transistor, Cp1 is the first parasitic capacitance, Cp2 is the second parasitic capacitance, C is the capacitance of the capacitor, and R is the resistance of the resistor.

20. The circuit of claim 16, wherein the circuit is a class-AB amplifier.

* * * * *